United States Patent
Cho et al.

(10) Patent No.: US 7,504,705 B2
(45) Date of Patent: Mar. 17, 2009

(54) STRIPED ON-CHIP INDUCTOR

(75) Inventors: Choongyeun Cho, Beacon, NY (US); Daeik Kim, Fishkill, NY (US); Jonghae Kim, Fishkill, NY (US); Moon J. Kim, Wappingers Falls, NY (US); Jean-Olivier Plouchart, New York, NY (US); Robert E. Trzcinski, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 11/536,896

(22) Filed: Sep. 29, 2006

(65) Prior Publication Data

US 2008/0079114 A1 Apr. 3, 2008

(51) Int. Cl.
*G06F 17/50* (2006.01)
(52) U.S. Cl. ............... 257/531; 716/5; 716/9; 716/11
(58) Field of Classification Search ........... 257/531; 716/9, 5, 11
See application file for complete search history.

(56) References Cited

U.S. PATENT DOCUMENTS

| | | | |
|---|---|---|---|
| 5,436,441 A | 7/1995 | Inoue | |
| 5,559,360 A | 9/1996 | Chiu et al. | |
| 6,146,958 A | 11/2000 | Zhao et al. | |
| 6,383,916 B1 | 5/2002 | Lin | |
| 6,455,915 B1 | 9/2002 | Wong | |
| 6,714,113 B1 | 3/2004 | Abadeer et al. | |
| 7,007,258 B2 * | 2/2006 | Li ........................... | 716/9 |
| 7,096,447 B1 * | 8/2006 | Li et al. ................... | 716/11 |
| 7,380,227 B1 * | 5/2008 | Li ........................... | 716/5 |
| 2004/0255258 A1 * | 12/2004 | Li ........................... | 716/8 |
| 2005/0114808 A1 | 5/2005 | McBride | |
| 2005/0156700 A1 | 7/2005 | Chang | |
| 2007/0300195 A1 * | 12/2007 | Li ........................... | 716/5 |
| 2008/0079114 A1 * | 4/2008 | Cho et al. ................. | 257/531 |
| 2008/0120586 A1 * | 5/2008 | Hoerold ................... | 716/9 |

FOREIGN PATENT DOCUMENTS

WO    WO 98/43258 A3    10/1998

OTHER PUBLICATIONS

International Search Report and Written Opinion dated Jan. 31, 2008, re PCT application, S/N PCT/ EP2007/059858 of International Business Machines Corporation.
"Magnetic film inductors for radio frequency applications", Korenivski et al, Journal of Applied Physics, Nov. 15, 1997, vol. 82, Issue 10, pp. 5247-5254 (http://scitation.aip.org).

* cited by examiner

*Primary Examiner*—Laura M Menz
(74) *Attorney, Agent, or Firm*—Patrick J. Daugherty; Driggs, Hogg, Daugherty & Del Zoppo Co., LPA

(57) ABSTRACT

Sub-100 nanometer semiconductor devices and methods and program products for manufacturing devices are provided, in particular inductors comprising a plurality of spaced parallel metal lines disposed on a dielectric surface and each having width, heights, spacing and cross-sectional areas determined as a function of Design Rule Check rules. For one planarization process rule a metal density ratio of 80% metal to 20% dielectric surface is determined and produced. In one example a sum of metal line spacing gaps is less than a sum of metal line interior sidewall heights. In one aspect at least one of line height, width and line spacing dimensions is selected to optimize one or more chip yield, chip performance, chip manufacturability and inductor Q factor parameters.

6 Claims, 4 Drawing Sheets

STRIPED ON-CHIP INDUCTOR

FIELD OF THE INVENTION

The present invention relates to semiconductor devices, and methods and program products for manufacturing semiconductor devices, and more particularly to on-chip inductor structures optimized for high-performance sub-100 nanometer semiconductor applications.

BACKGROUND OF THE INVENTION

Smaller sizes in semiconductor chip fabrication generally lead to corresponding increases in available circuit board real estate and processing speed. Sub-100 nanometer semiconductor technology and methods provide for efficient and fast chip structures, such as circuit lines and gates fabricated on a nanometer-scale; for example, sub-100 nm structures formed through nanolithography patterns may have a lateral dimension between the size of an individual atom and approximately 100 nm.

However, sub-100 nm semiconductor technology presents a number of challenges. Wherein larger semiconductor structures may be manually designed, sub-100 nanometer processes generally require design engineers to use sophisticated Electronic Design Automation (EDA) tools to convert method and process algorithms directly into circuit structures. And, accordingly, a chip designer must also generally use an EDA tool to confirm chip design manufacturability and acceptable yield optimization.

Design Rule Checking or Check(s) (DRC) refers to EDA determination as to whether a particular chip design satisfies a series of recommended parameters called Design Rules. The main objective of DRC is to achieve a high overall yield and reliability for the design. If design rules are violated, the design may not be functional.

However, conventional chip design techniques may incorporate post-design manufacturing steps outside of the control of the chip designer. Such steps may add extra cost and time to the chip manufacturing process, degrading inductor manufacturing performance and yield beyond that specified or allowable under DRC. Accordingly, computationally intensive DRC routines must be run to verify chip performance and yield during physical verification of the design.

In view of the foregoing, there exists a need for a solution that solves at least one of the deficiencies of the related art.

SUMMARY OF THE INVENTION

Aspects of the present invention address these matters and others.

In accordance with one aspect of the present invention, a semiconductor structure and method for design and manufacture is provided, comprising a plurality of spaced sub-100 nanometer parallel metal lines disposed on a dielectric surface and connecting first and second inductor ports. The lines each have a width and a cross-sectional area, each line spaced from an adjacent line by a spacing gap, each a function of Design Rule Check rules.

In one aspect, the Design Rule Check rules comprise a Chemical Mechanical Planarization metal ratio rule. In another aspect, the plurality of line widths, cross-sectional areas and spacing gaps define a metal density ratio of 80% metal to 20% dielectric surface.

In one aspect, the plurality of line widths, cross-sectional areas and spacing gaps are constant over a total inductor length. In another aspect, the inductor is formed in a top Chemical Mechanical Planarization metal layer of a complementary metal oxide semiconductor configured for 10 GHz radio frequencies. In another aspect, each of the lines have sidewalls having sidewall heights, and wherein a sum of the spacing gaps is less than a sum of line interior sidewall heights.

In one example, each line width is greater than or equal to about 0.8 microns and less than or equal to about 8 microns, and wherein each spacing gap is greater than or equal to about 0.8 microns. In another example, the plurality of lines has progressively larger line widths from a first innermost line to a last outermost line. In one aspect, the plurality of lines may further comprise a plurality of connector lines, each connector line connecting at least two of the spaced parallel lines.

In one aspect, a method is provided for forming a semiconductor inductor by using an Electronic Design Automation tool to determine sub-100 nanometer process metal line height, width and line spacing dimensions as a function of Design Rule Check rules, and forming a plurality of spaced parallel metal lines on a dielectric substrate between first and second ports according to the specified dimensions. In one aspect, specifying the line height, width and line spacing dimensions comprises selecting at least one of the line height, width and line spacing dimensions to optimize one or more chip yield, chip performance, chip manufacturability and inductor Q factor parameters. In one aspect, the plurality of spaced parallel metal lines has sidewall heights and the lines are formed wherein a sum of the spacing gaps is less than a sum of line interior sidewall heights.

A method is also provided comprising producing computer executable program code; storing the produced program code on a computer readable medium; and providing the program code to be deployed to and executed on a computer system. The program code comprises instructions which, when executed on the computer system, causes the computer system to determine sub-100 nanometer metal line height, width and line spacing dimensions as a function of Design Rule Check rules and form a plurality of spaced parallel metal lines on a substrate according to the specified height, width and line spacing dimensions. In one aspect, the Design Rule Check rules comprise a Chemical Mechanical Planarization metal ratio rule, and the program code, when executed on the computer, causes the computer to specify the plurality of line widths, cross-sectional areas and spacing gaps to conform to the metal ratio rule. In another aspect, the program code causes the computer to select at least one of the line height, width and line spacing dimensions to optimize a parameter selected from the group comprising chip yield, chip performance, manufacturability and inductor Q factor.

BRIEF DESCRIPTION OF THE DRAWINGS

These and other features of this invention will be more readily understood from the following detailed description of the various aspects of the invention taken in conjunction with the accompanying drawings in which.

Figure 1:
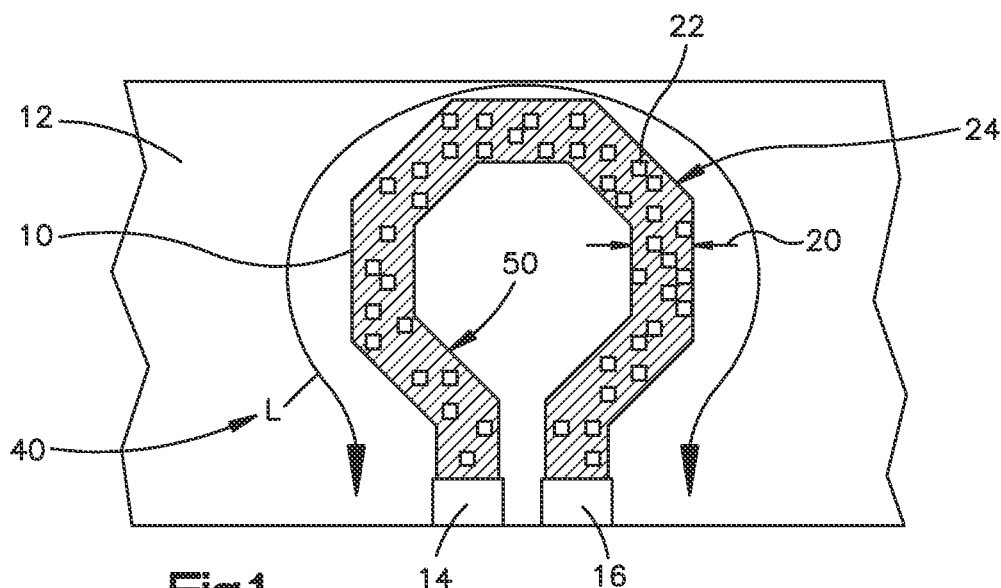
FIG. 1 is a schematic illustration of a conventional prior art inductor formed on a semiconductor.

The invention may take form in various components and arrangements of components, and in various steps and arrangements of steps. The drawings are intended to depict only typical embodiments of the invention and are not to be considered as limiting the scope of the invention. Moreover, the drawings are not necessarily to scale and are merely schematic representations not intended to portray specific parameters of the invention. In the drawings, like numbering represents like elements.

DETAILED DESCRIPTION OF THE INVENTION

Still further aspects of the present invention will be appreciated by those of ordinary skill in the art upon reading and understanding the following detailed description.

For convenience purposes, the Detailed Description of the Invention has the following sections:

I. General Description; and

II. Computerized Implementation.

I. General Description

FIG. 1 is a schematic illustration of a conventional sub-100 nm inductor 10 formed from a single line on a complementary metal oxide semiconductor (CMOS) semiconductor dielectric material layer 12 between a first port 14 and a second port 16. The inductor is a passive component commonly incorporated into semiconductor circuit structures for high-performance radio-frequency (RF) applications.

The inductance value of the inductor 10 is dependent upon its length L 40, and the quality of the inductor 10 is dependent upon the resistance of the inductor metal line structure, which is in turn dependent upon its width 20. A larger width 20 generally reduces the resistance of the inductor 10. In order to provide for a high Q factor, it is generally preferred to reduce the resistance of the inductor 10 by providing a large width 20. However, in some high-performance RF applications, a solid stripe inductor 10 with a width sufficient to produce a desired resistance does not comply with one or more DRC design rules, including in particular CMP process metal ratios.

More particularly, to design and produce an inductor 10 through EDA techniques that meet sub-100 nm chip manufacturing yield goals generally requires the application of complex DRC rule routines. DRC routines may modify existing features, insert new features, and/or check the entire design for process limitations. While DRC steps may not validate that a design will operate correctly, the DRC rules are generally constructed to verify that the structure meets the process constraints for a given design type and process technology.

One DRC process limitation in IC design is Chemical-Mechanical Planarization (CMP) metal fill density or ratio. CMP, which may also refer to chemical-mechanical polishing, is a technique used in semiconductor fabrication for planarizing the top surface of a semiconductor substrate used in the formation of on-chip inductors. DRC rules for CMP process for sub-100 nm CMOS structures generally require an inductor 10 metal layer density ratio of 80% metal/20% inter-metal dielectric material 12. Accordingly, the solid inductor 10 must be further processed in order to comply with DRC CMP process requirements.

One conventional approach is to remove portions of the single homogenous metal line inductor 10 through a post-design "cheesing process" step, wherein discrete pieces of the inductor metal are removed to create a plurality of holes 22 in the inductor 10. Thus, the plurality of holes 22 reduces the metal/oxide ratio of the cheesed inductor 10 from a solid metal line ratio of 100% to the required 80% metal/20% oxide ratio.

However, conventional post-design "cheesing process" techniques present problems. In one aspect the plurality of inductor holes 22 defines an array pattern 24 which has an effect on the resistance of the inductor at high RF frequencies. At high operational frequencies, such as 10 GHz, sub-100 nanometer chip inductors exhibit resistance values which vary along the length L 40 of the inductor 10 dependent upon the specific array pattern 24. A higher number of holes 22 will exhibit different resistance and Q factor performance than another point along the length L 40 of the inductor with a divergent number of holes 22.

The cheesing step also adds extra cost and time to the chip manufacturing process, degrading inductor manufacturing performance and yield. Moreover, the post-design "cheesing step" forms the array pattern 24 outside of the control of the chip designer. Random array patterns 24 may cause random perturbations in the expected Q factor of the inductor 10, perhaps resulting in inductor 10 quality Q factors below a performance expected and/or specified by the circuit designer. Thus, a computationally expensive DRC metal ratio test must be run on the cheesed inductor 10, significantly lowering manufacturing efficiencies.

Figure 2:
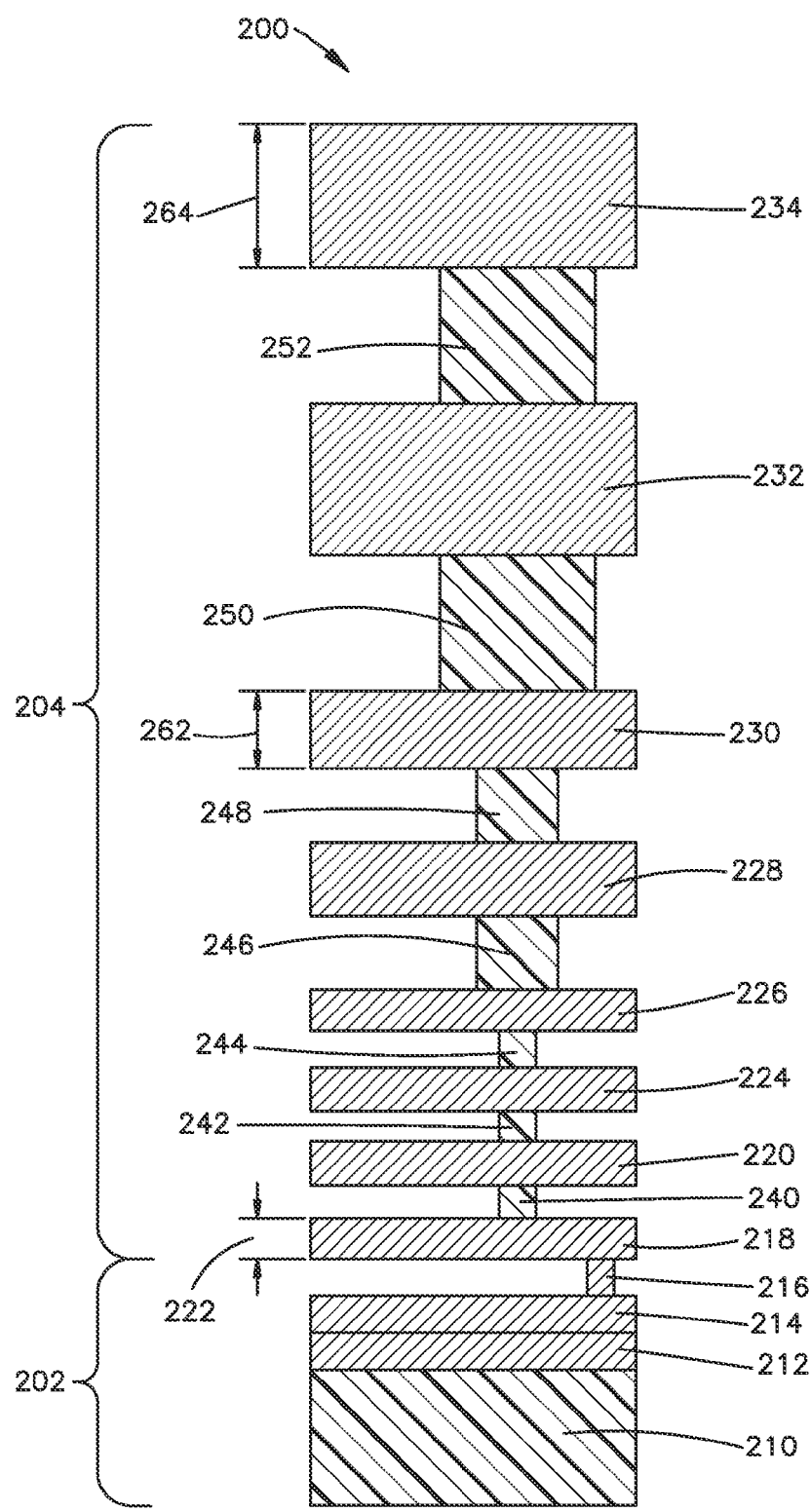
FIG. 2 is a schematic side illustration of a high-performance RF CMOS structure according to the present invention.

Referring now to FIG. 2, a schematic side illustration of a high-performance RF integrated circuit chip (IC) 200 according to the present invention is provided having two regions: a Front End Of (production) Line (FEOL) 202 and a Back End Of the Line (BEOL) 204. FEOL and BEOL generally refer to chip levels with respect to their stage of fabrication. The FEOL 202 comprises early process transistor element stage structures, for example those formed through dopant diffusion and implantation, the sputtering of gate films, oxidations, and the patterning steps associated therewith. The present example provides silicon and polysilicon transistor element layers 212, 214, and tungsten contacts (CA) 216 located between a BEOL first metal layer 218 and the polysilicon layer 214. However, other FEOL structures and configurations may be practiced according to the present invention.

The BEOL comprises metallization structures and interconnects and vias (vertical interconnects between planar interconnects) and associated non-conducting depositions and growths (for example, polymers, glasses, oxides, nitrides, and oxinitrides) for electrical isolation, dielectrics (for capacitance), diffusion barriers, and mechanical passivation (in particular, to prevent failure of interconnects by electromigration and stress migration). In the present example, the BEOL 204 comprises eight (8) metallization layers 218, 220, 224, 226, 228, 230, 232, 234 separated by dielectric material layers 240, 242, 244, 246, 248, 250, 252 which each comprise vias or other interconnective structures (not shown) that electrically connect adjacent metal layers. The metal layers become progressively larger toward the top of the structure, wherein the bottom four metal layers 218, 220, 224, 226 have a first metal thickness 222, the middle two layers 228, 230 have a second metal thickness 262 about twice the first metal thickness 222, and the top two layers 232, 234 have a third metal thickness 264 about twice the second metal thickness 262. Nevertheless, it is to be understood that other BEOL structures and configurations may be practiced according to the present invention.

Figure 3:
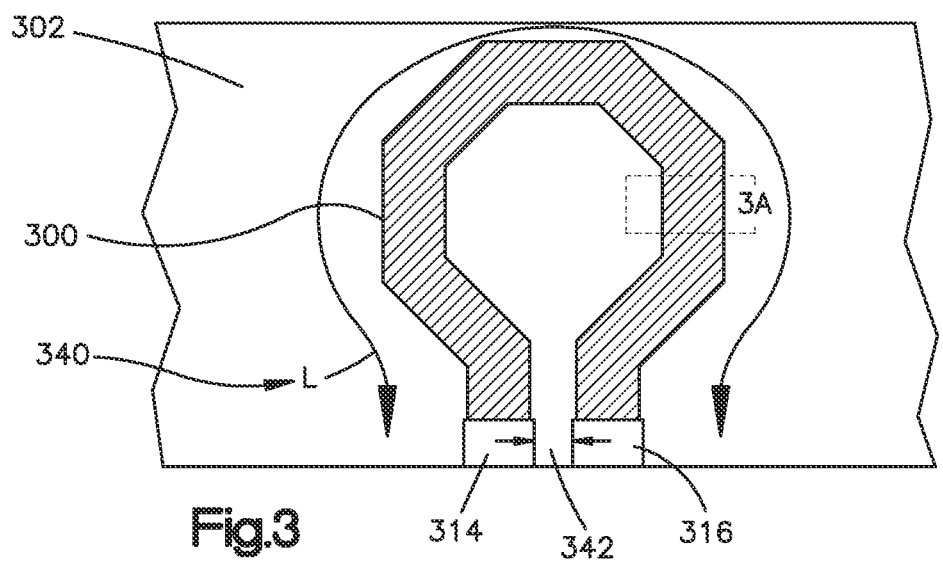
FIGS. 3 and 3(a) are schematic illustrations of an inductor according to the present invention.

Referring now to FIG. 3, a multiline inductor 300 according to the present invention is formed at the top CMP process metal layer 243 on the top dielectric material layer 252 between a first port 314 and a second port 316. It is preferable to locate the inductor 300 in one or both of the largest top metal layers 232, 234 as larger metal layers enable lower resistance values and higher Q factor values over the same widths 320 of inductors (not shown) formed in the other smaller metal layers 218, 220, 224, 226, 228, 230. Moreover, using the top layer 234 is also most efficient in manufacturing the chip 200. However, the inductor 300 may be formed within one or more of said other layers 218, 220, 224, 226, 228, 230, and the present invention is not limited to the embodiment 200 presently discussed. Additionally, in some embodiments, the inductor 300 may be formed in a parallel structure of two of the metal layers 218, 220, 224, 226, 228, 230, 232, 234; for example, the two top layers 234/232 or the two middle layers 230/228.

Figure 3A:
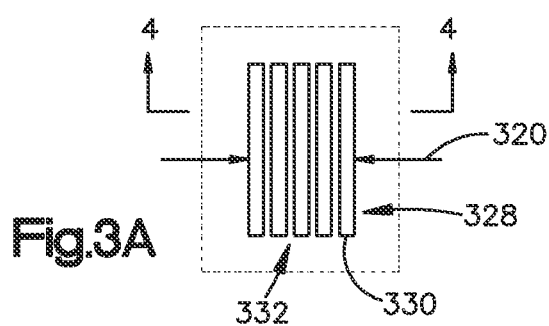
Figure 4:
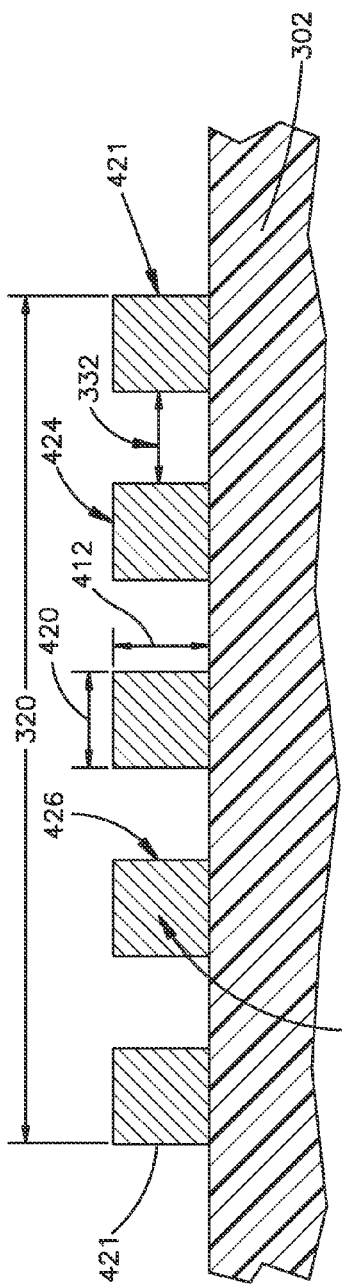
FIG. 4 is a cross-sectional view of the inductor of FIGS. 3 and 3(a), taken along the indicated lines.

Referring to FIGS. 3a and 4, the inductor 300 comprises a plurality 328 of thin line inductors 330 spaced 332 in parallel on the top dielectric material layer 252. Each of the lines 330 has a height 412 of the original metal line, which is generally the thickness 264 of the top metal layer 234. However, other line heights 412 different from the original metal layer thickness 264 may also be practiced. The specific split line 330 height and width dimensions 412, 420 and spacing 332 are specified by the designer as a function of DRC rules.

At high frequencies, RF chip inductors exhibit "skin effect", wherein high-frequency alternating current (AC) signals travel through the inductor 300 near the inductor surfaces 421, 424, 426 rather than uniformly through the entire inductor line 330. Accordingly, at 10 gigahertz RF electromagnetic waves travel more along the surfaces 421, 424, 426 than the interior or core of the inductor metal lines 330 due to skin effect. Therefore, although overall conducting metal volume in the split line inductor 300 is decreased compared to a conventional inductor 10 solid-line section 50 for common widths 320 and 20, actual RF conducting surfaces are increased due to the added split line sidewall surfaces 426 where interior sidewall heights in the gap regions define a total metal surface cross-sectional area greater than the total gap widths. Consequently, the effective RF resistance of the multiline inductor 300 is smaller than the conventional solid-line inductor 10, and the quality factor Q, which is inversely proportional to the conductor line resistance, is enhanced. Although the present example provides advantages in the frequency range of about 10 gigahertz, the present invention may be practiced and provide advantages in other RF CMOS application frequency ranges.

More particularly, for common inductor widths 20 and 320 the inductor 300 may provide a metal surface cross-section width greater than that provided by a solid portion cross-section 50 of the line inductor 10. The metal surface cross-section width along the width 320 is defined by the total of the five top line surface 424 widths 420 and the eight interior sidewall surface 426 and two outer edge wall surface 421 heights. Thus, where the sum of the spacings 332 between adjacent inductor stripe lines 330 is less than the sum of the interior sidewall heights 412, the total inductor 300 metal surface width along the cross-section illustrated in FIG. 4 is, therefore, greater than the inductor 10 surface width at a solid cross-section 50, and accordingly the inductor 300 provides a larger conducting metal surface than the conventional inductor 10 solid line portion 50 for the same width 20, 320, thereby through skin effect having a lower resistance at high RF frequencies.

Moreover, by specifying constant height and width 412, 420 and spacing 332 dimensions over the length L 340, a chip designer may provide for a constant skin effect resistance performance along the entire length L 340 of the inductor 300. This may be contrasted with the conventional inductor 10, which is only compliant with high-performance RF CMP design rules after creation of the plurality of holes 22 produced by post-design cheesing techniques outside of the control of the chip designer. And as the cheesed array pattern 24 does not provide consistent cross-sectional surface area dimensions along the length L 40 of the inductor 10, the effective resistance along the surface of the inductor 10 varies dependent upon the number of holes 22 or portions thereof present within any particular cross-section location, resulting in different resistance values along the length L 40 of the inductor 10. The different surface areas along the length L 40 of the conventional cheesed inductor 10 caused by an irregular array pattern 24 also causes perturbations in inductor resistance and reduces the overall Q factor of the inductor 10 as the RF signals travel along the inductor 10.

Since the split line 330 widths 420 and spacing 332 are designed as a function of applicable DRC design rules, there is no need to perform computationally expensive post-design CMP ratio rule execution routines to determine whether or not the inductor 300 design satisfies this ratio, thereby providing chip production and cost efficiencies for reducing post-process verification steps. Moreover, by avoiding the post-design cheesing process steps required in manufacturing of the conventional inductor 10, the inductor 300 has better uniformity than the conventional inductor 10, whose physical property is randomly modulated by the post-design cheesing process required to meet the CMP ratio. This also enables the inductor 300 to provide a better model-to-hardware correlation than that provided by the conventional cheesed inductor 10.

Thus, the inductor 300 has a metal area density controlled by DRC CMP ratio rules specific for the appropriate chip yield and performance parameters during its initial design. In one aspect, the metal line width 420 and line spacing 332 are within a DRC rule check range, with maximum and minimum metal line width 420 and minimum line spacing 332 specified during the design as a function of the DRC rules. In one example, an inductor 300 compliant with sub-100 nm DRC design rules, including CMP ratios for a 10 GHz application, has a split line 330 width 420 minimum of about 0.8 microns and a maximum of about 8 microns, with a minimum metal line spacing 332 of about 0.8 microns.

In another aspect, the metal line 330 widths 420 and metal line spacing 332 may be selected to attain the highest Q factor and/or lowest radio frequency resistance for a given specified inductor value, process design rule(s), and/or CMP ratio requirement. By reducing the split line spacing 332 to a specified minimum, and by maximizing total inductor 300 conducting metal surface (the sum of the side and edge wall heights 412 and the top surface widths 420), the DRC rules may be used to optimize the quality factor Q. In another embodiment, the split line spacing 330 may be lower-limited by a specified minimum inductor metal line width 320 in a CMP design rule, for example to optimize yield, performance and/or manufacturability. In another embodiment, an optimum split line width 420 is determined as a function of a maximum allowed metal line with 320 and a CMP ratio requirement.

It is generally preferred to locate the first and second inductor ports 314, 316 near to each other. Accordingly, the inductor 300 has a generally octagonal shape that provides a long overall inductor length L 340 (and thereby a corresponding inductance value in proportion to the length L 340) while still enabling placement of the first and second ports 314, 316 near to each other, spaced by a spacing distance 342. However, it is to be understood that other inductor 300 shapes and configurations may be practiced, and the present invention is not limited to the octagonal shape illustrated.

Another advantage of the multiline structure 300 is an improved redundancy. Thus, where one or more of the individual lines 330 fail to perform, such as in the case of a BEOL short and open, others lines 330 remain operational and available for signal conveyance through their parallel arrangement.

Figure 5:
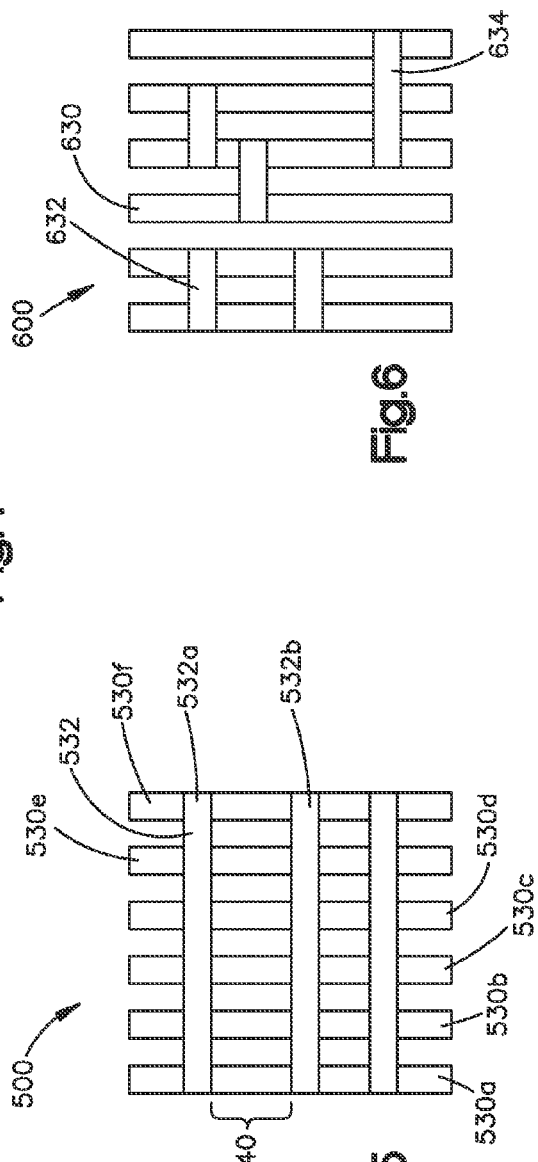
FIG. 5 is a schematic illustration of a portion of another inductor according to the present invention.

FIG. 5 illustrates an alternative multiline inductor structure portion 500 appropriate for the inductor 300 according to the present invention. A plurality of parallel thin inductor lines 530 are again provided between the first and second inductor ports 314, 316. What is new is that the lines 530 are also connected by a plurality of perpendicular thin connector lines 532. The number and dimensions of the parallel thin inductor lines 530 and perpendicular thin connector lines 532 are dependent upon one or more applicable design rule(s), as described generally above; for example, in one embodiment for a 10 gigahertz RF CMOS application, the CMP 80% metal/20% interposing oxide ratio requirement is followed in the design and formation of the inductor 500.

The inductor structure 500 provides additional redundancy advantages over the split parallel line inductor 300. As each of the perpendicular thin connector lines 532 is connected to all of the parallel thin inductor lines 530, each of the parallel thin inductor lines 530 may function as a backup to any of the other parallel thin inductor lines 530 or portions thereof in the case of an inductor line 530 failure, such as through a short or open. Thus, if portion 540 of line 530a fails, then one or more of lines 530b-530f may carry signal information traveling along line 530a through electrical connection of each affected by connector lines 532a and 532b.

Figure 6:
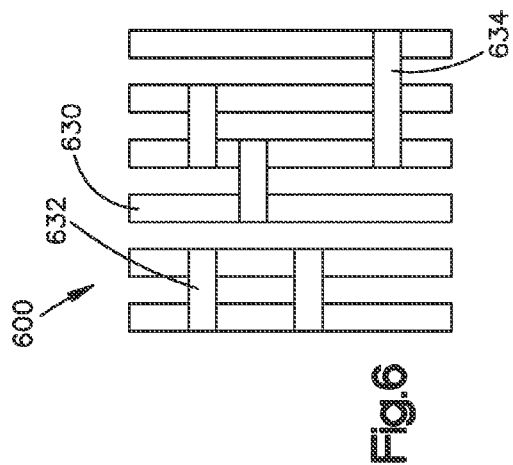
FIG. 6 is a schematic illustration of a portion of another inductor according to the present invention.

FIG. 6 illustrates another alternative multiline inductor structure 600 appropriate for the inductor 300 according to the present invention, wherein a plurality of parallel thin inductor lines 630 are provided between the first and second inductor ports 314, 316 and two or more of each of the lines 630 are connected by one or more of a plurality of perpendicular thin connector lines 632, 634. In the present embodiment, a plurality of two-line connectors 632, and at least one three-line connector 634 are shown, although other pluralities and connector lines may be practiced, such one or more three-line, four-line, five-line and/or all six-line connectors (not shown). Again, the number and dimensions of the parallel thin inductor lines 630 and perpendicular thin connector lines 632, 634 are dependent upon the applicable design rules, such as the CMP 80% metal/20% interposing oxide ratio requirement for a 10 gigahertz RF CMOS. Although the inductor structure 600 does not offer the same level of redundancy advantages as the inductor structure 500 due to fewer parallel inductor line 630 interconnections, it still provides additional redundancy advantages over the split line inductor 300.

Figure 7:
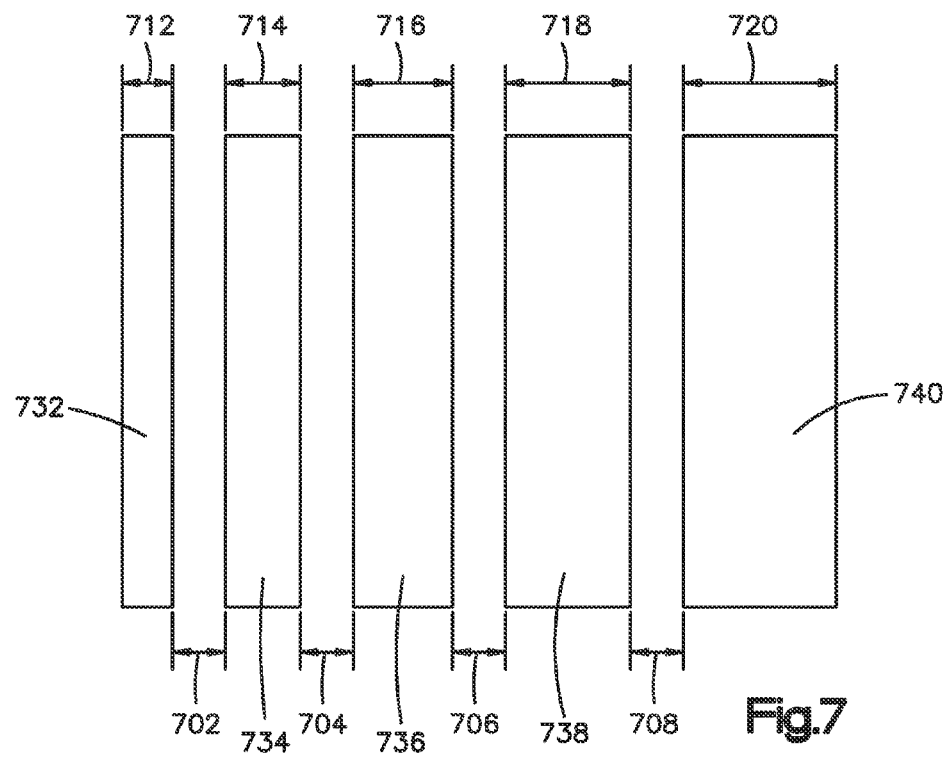
FIG. 7 is a schematic illustration of a portion of another inductor according to the present invention.

FIG. 7 illustrates another alternative multiline inductor structure 700 appropriate for the inductor 300 according to the present invention, wherein parallel inductor lines 723-740 have different line widths 712-720, respectively, and are separated by spacing gaps 702-708, respectively, as illustrated. Again, each of the split line widths 712-720 and spacing gaps 702-708 are designed as a function of applicable DRC design rules. The inductor 700 provides additional Q-factor optimization by progressively increasing the widths of outer wires 712-720, wherein the outermost wire 740 has the largest width 720.

II. Computerized Implementation

Figure 8:
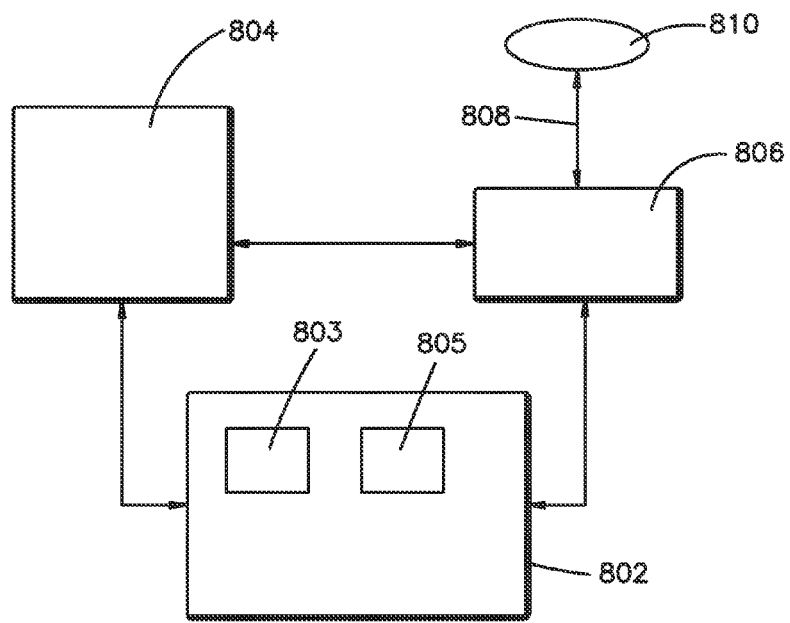
FIG. 8 is a schematic illustration of a computer system appropriate for use with the present invention.

Referring now to FIG. 8, the present invention may also be practiced in the form of providing a program to be executed by a computer system 802, for example a computer system 802 using an EDA tool as described above. Thus, a program according to the present invention may be stored on a computer readable storage medium 804 and/or accessible through one or more transmission mediums 806, 808. To this extent, the computer-readable/useable medium includes program code that implements each of the various process steps of the invention. It is understood that the terms computer-readable medium or computer useable medium comprises one or more of any type of physical embodiment of the program code. In particular, the computer-readable/useable medium can comprise program code embodied on one or more portable storage articles of manufacture (e.g., a compact disc, a magnetic disk, a tape, etc.), on one or more data storage portions of a computing device, such as memory 803,805 and/or storage system 804 (e.g., a fixed disk, a read-only memory, a random access memory, a cache memory, etc.), and/or as a data signal (e.g., a propagated signal) traveling over a network (e.g., during a wired/wireless electronic distribution of the program code).

Illustrative but not exhaustive storage medium examples include volatile memory structures, and RAM and ROM structures, but the present invention is not so limited. In one aspect of operation, the program code may be read by a disk drive or a CD-ROM reading apparatus 805 and stored in a flash ROM 803 or the like in the computer system 802 so as to be executed. In addition, a transmission medium, such as network 808, is usable by a program transmitting apparatus 806 to provide the program to the computer system 802; in some examples, the program may reside on a remote computer resource 810. As for the program transmitting apparatuses 806, it is sufficient to have a computer memory 803, 804 for storing the program and program transmitting means 806 for providing the program to the computer system 802 or memory 803, 804 via the network 808.

It is to be understood that embodiments of the computer system 802 include stand-alone and networked computers and multi-part computer systems. More particularly, FIG. 8 is provided to demonstrate, among other things, that the present invention could be implemented within a network environment (e.g., the Internet, a wide area network (WAN), a local area network (LAN), a virtual private network (VPN), etc.), or on a stand-alone computer system. In the case of the former, communication throughout the network can occur via any combination of various types of communications links. For example, the communication links can comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet. Moreover, the computer system 802 is intended to demonstrate that some or all of the components of implementation depicted in FIG. 8 could be deployed, managed, serviced, etc. by a service provider who offers to implement, deploy, and/or perform the functions of the present invention for others.

Computer system 802 is only illustrative of various types of computer infrastructures for implementing the invention. For example, in one embodiment, computer system 802 comprises two or more computing devices (e.g., a server cluster) that communicate over a network to perform the various process steps of the invention. Moreover, computer system 802 is only representative of various possible computer systems that can include numerous combinations of hardware. To this extent, in other embodiments, computer system 802 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively. Further, I/O interface 808 can comprise any system for exchanging information with one or more external device 810. Still further, it is understood that one or more additional components (e.g., system software, math co-processing unit, etc.) not shown in FIG. 8 can be included in computer system 802.

Storage system 804 can be any type of system (e.g., a database) capable of providing storage for information under the present invention. To this extent, storage system 804 could include one or more storage devices, such as a magnetic disk drive or an optical disk drive. In another embodiment, storage system 804 includes data distributed across, for example, a local area network (LAN), wide area network (WAN) or a storage area network (SAN) (not shown). In addition, although not shown, additional components, such as cache memory, communication systems, system software, etc., may be incorporated into computer system 802.

In another embodiment, the invention provides a business method that performs the process steps of the invention on a subscription, advertising, and/or fee basis. That is, a service provider, such as a Solution Integrator, could offer to design and/or manufacture striped inductors. In this case, the service provider can create, maintain, support, etc., a computer infrastructure, such as a computer infrastructure 802 that performs the process steps of the invention for one or more customers. In return, the service provider can receive payment from the customer(s) under a subscription and/or fee agreement and/or the service provider can receive payment from the sale of advertising content to one or more third parties.

In still another embodiment, the invention provides a computer-implemented method for managing conference calls. In this case, a computer infrastructure, such as computer infrastructure 802, can be provided and one or more systems for performing the process steps of the invention can be obtained (e.g., created, purchased, used, modified, etc.) and deployed to the computer infrastructure. To this extent, the deployment of a system can comprise one or more of: (1) installing program code on a computing device 802, from a computer-readable medium 804; (2) adding one or more computing devices (not shown) to the computer infrastructure 802; and (3) incorporating and/or modifying one or more existing systems of the computer infrastructure 802 to enable the computer infrastructure 802 to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after either or both of the following: (a) conversion to another language, code or notation; and/or (b) reproduction in a different material form. To this extent, program code can be embodied as one or more of: an application/software program, component software/a library of functions, an operating system, a basic I/O system/driver for a particular computing and/or I/O device, and the like.

While preferred embodiments of the invention have been described herein, variations in the design may be made, and such variations will be apparent to those skilled in the art of inductors, as well as to those skilled in other arts. It is to be understood that the present invention is not limited to the sub-100 nm CMOS inductor examples discussed above, but may be applied to other semiconductor technologies that use lithography and BEOL stacking manufacturing techniques. Illustrative but not exhaustive examples include SiGe, Bipolar, and III-VI semiconductor structures and methods of manufacturing. Also, although the nanolithography techniques discussed above typically comprehend copper CMP processes, the inductor lines may be formed from a variety of metal materials, illustratively but not exhaustively including aluminum and other semiconductor metal layer materials. CMP process metal density ratios different from those discussed above may also be practiced. And although the present examples discuss 10 GHz applications, the present invention will provide improved DRC-responsive design, yield and performance benefits in higher frequency sub-100 nm semiconductor applications, for example providing better inductor Q-performance for multiline inductors through improved skin effect behavior at operating frequencies from above 10 GHZ to about 100 GHz.

We claim:

1. A method for forming a semiconductor inductor comprising the steps of:
    using an Electronic Design Automation tool to determine sub-100 nanometer process metal line height, width and line spacing dimensions as a function if Design Rule Check rules; and
    forming a plurality of spaced parallel metal lines on a dielectric substrate between first and second ports according to the determined height, width and line spacing dimensions;
    wherein the Design Rule Check rules comprise a Chemical Mechanical Planarization metal ratio rule, and further comprising forming the plurality of line widths, cross-sectional areas and spacing gaps to comply with the metal ratio rule.

2. The method of claim 1, wherein the step of determining the line height, width and line spacing dimensions further comprises the step of selecting at least one of the line height, width and line spacing dimensions to optimize a parameter selected from the group comprising chip yield, chip performance, chip manufacturability and inductor Q factor.

3. The method of claim 1 further comprising the steps of:
    selecting each of the line widths greater than or equal to about 0.8 microns and less than or equal to about 8 microns;
    and selecting each of the spacing gaps greater than or equal to about 0.8 microns.

4. The method of claim 1 further comprising the step of:
    forming a plurality of connector lines each connecting at least two of the spaced parallel lines according to the specified height, width and line spacing dimensions.

5. The method of claim 1, wherein the step of forming the plurality of spaced parallel metal lines further comprises the step of:
    forming the lines with interior sidewalls in gap regions, the interior sidewalls each having interior sidewall heights, wherein a sum of the spacing gaps is less than a sum of the interior sidewall heights.

6. The method of claim 1, wherein the step of forming the plurality of spaced parallel metal lines comprises forming the lines with progressively larger line widths from a first innermost line to a last outermost line.

* * * * *